(12) United States Patent
Jensen (10) Patent No.: US 11,233,024 B2
(45) Date of Patent: Jan. 25, 2022

(54) METHODS FOR FORMING SUBSTRATE TERMINAL PADS, RELATED TERMINAL PADS AND SUBSTRATES AND ASSEMBLIES INCORPORATING SUCH TERMINAL PADS

(71) Applicant: Micron Technology, Inc., Boise, ID (US)

(72) Inventor: Travis M. Jensen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/855,730

(22) Filed: Apr. 22, 2020

(65) Prior Publication Data
US 2021/0193601 A1 Jun. 24, 2021

Related U.S. Application Data

(60) Provisional application No. 62/952,987, filed on Dec. 23, 2019, provisional application No. 62/956,533, filed on Jan. 2, 2020.

(51) Int. Cl.
*H01L 23/00* (2006.01)

(52) U.S. Cl.
CPC .............. *H01L 24/05* (2013.01); *H01L 24/03* (2013.01); *H01L 24/13* (2013.01); *H01L 2224/03614* (2013.01); *H01L 2224/0401* (2013.01); *H01L 2224/05011* (2013.01); *H01L 2224/13026* (2013.01)

(58) Field of Classification Search
CPC ......... H01L 24/05; H01L 24/03; H01L 24/13; H01L 2224/03614; H01L 2224/0401; H01L 2224/05011; H01L 2224/13026
See application file for complete search history.

(56) References Cited

U.S. PATENT DOCUMENTS

2006/0027933 A1* 2/2006 Chen ...................... H01L 24/81
257/772
2019/0139918 A1* 5/2019 Shindo ................... H01L 24/02

* cited by examiner

*Primary Examiner* — Douglas W Owens
(74) *Attorney, Agent, or Firm* — TraskBritt (57) ABSTRACT

An apparatus comprising a substrate having conductive traces and associated integral terminal pads on a surface thereof, the terminal pads having an irregular surface topography formed in a thickness of a single material of the conductive traces and integral terminal pads. Solder balls may be bonded to the terminal pads, and one or more microelectronic components operably coupled to conductive traces of the substrate on a side thereof opposite the terminal pads. Methods of fabricating terminal pads on a substrate, and electronic systems including substrates having such terminal pads are also disclosed.

15 Claims, 6 Drawing Sheets

METHODS FOR FORMING SUBSTRATE TERMINAL PADS, RELATED TERMINAL PADS AND SUBSTRATES AND ASSEMBLIES INCORPORATING SUCH TERMINAL PADS

CROSS-REFERENCE TO RELATED APPLICATIONS

This application claims the benefit of the filing date of U.S. Provisional Patent Application Ser. No. 62/952,987 filed Dec. 23, 2019, for "METHODS FOR FORMING SUBSTRATE TERMINAL PADS, RELATED TERMINAL PADS AND SUBSTRATES, ASSEMBLIES AND ELECTRONIC SYSTEMS INCORPORATING SUCH TERMINAL PADS," and of U.S. Provisional Patent Application Ser. No. 62/956,533, filed Jan. 2, 2020, for "METHODS FOR FORMING SUBSTRATE TERMINAL PADS, RELATED TERMINAL PADS AND SUBSTRATES, ASSEMBLIES AND ELECTRONIC SYSTEMS INCORPORATING SUCH TERMINAL PADS," the disclosure of each of which is hereby incorporated herein in its entirety by this reference.

TECHNICAL FIELD

Embodiments disclosed herein relate to terminal pads for substrates for microelectronic component assemblies and to methods of forming such terminal pads. More particularly, embodiments disclosed herein relate to terminal pads exhibiting enhanced interface strength with solder balls, methods of forming such terminal pads, and to substrates, microelectronic component assemblies and electronic systems incorporating such terminal pads.

BACKGROUND

Conductive elements in the form of solder joints (i.e., solder balls, solder bumps) comprising a single metal material (e.g., metal, metal alloy) have been used for decades to physically and electrically connect microelectronic components to one another, to substrates, and to higher level packaging. While providing relatively robust connections, as operational demands in terms of increased temperature swings in thermal cycling, ever-increasing numbers of thermal cycles during operation lifespans of electronic systems, as well as increasingly smaller microelectronic form factors with attendant smaller solder joint pitches and solder volumes per joint increase the potential for joint failure and open circuits. Severe usage environments, such as automotive applications and server applications further enhance the potential for solder joint failure.

The failure mechanism for solder joints in the form of reflowed masses of solder comprising a single metal material (e.g., solder balls, solder bumps) connecting, for example, a microelectronic component to another microelectronic component, may be briefly described. At time t=0, a solder mass has been heated to a liquidus state (for example, in an oven) to reflow in the presence of an appropriate flux to wet a bond pad of a microelectronic component (for example, a semiconductor die) on which the solder mass has been placed, and to an aligned terminal pad of another, adjacent microelectronic component (for example, a substrate), to form a solder joint (i.e., solder ball) bonding to the bond pad and terminal pad upon cooling. The solder ball is metallurgically bonded to so-called under-bump metallization (UBM) on the bond pad, the UBM comprising multiple different metal layers to ensure bonding between the metal of the bond pad and the alloy of the solder joint. The solder ball is also metallurgically bonded to the metal (e.g., copper, nickel) terminal pad, from which extends a conductive trace for connection to higher-level packaging. In operation as the joined microelectronic components cycle between low and high temperatures and after a number of such thermal cycles, a crack may commence to propagate between a terminal portion of the solder ball bonded to the terminal pad and the remainder of solder ball, which remains intact and firmly bonded to bond pad. As operation continues through more thermal cycles, the crack continues to propagate through and along the interface between the terminal pad and the solder ball until the crack extends completely across the interface, resulting in a discontinuity and a failed interconnect in the form of an open circuit. Similarly, instead of cracking, the solder ball may delaminate at the metallurgical bond with the terminal pad, which has a substantially planar (i.e., flat) surface. The same problems arise when, for example, a substrate bearing multiple microelectronic components is connected by solder balls to still higher-level packaging, such as a motherboard. As noted previously, with each decrease in pitch and solder joint size as form factors shrink, the solder volume and surface area thereof connecting microelectronic components becomes further limited and more susceptible to failure.

DETAILED DESCRIPTION

Terminal pads for microelectronic components (e.g., substrates) are described, as well as a process for fabricating such terminal pads, substrates equipped with such terminal pads, and electronic systems comprising microelectronic components so equipped.

The following description provides specific details, such as sizes, shapes, material compositions, and orientations in order to provide a thorough description of embodiments of the disclosure. However, a person of ordinary skill in the art will understand and appreciate that the embodiments of the disclosure may be practiced without necessarily employing these specific details, as embodiments of the disclosure may be practiced in conjunction with known fabrication techniques employed in the industry. In addition, the description provided below may not form a complete process flow for manufacturing terminal pads, a microelectronic component (e.g., substrate) equipped with such terminal pads, or apparatus (e.g., microelectronic component assembly, electronic system, etc.) including such terminal pads. Only those process acts and structures necessary to understand the embodiments of the disclosure are described in detail below. Additional acts to form a complete terminal pad, a complete microelectronic component (e.g., substrate) equipped with such terminal pads, or a complete apparatus (e.g., a complete microelectronic component assembly, electronic system, etc.) including terminal pads as described herein may be performed by known fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be inorganic, for example, a semiconductor substrate, a base semiconductor layer on a supporting structure, a semiconductor substrate having one or more materials, layers, structures, or regions formed thereon. The materials on the semiconductor substrate may include, but are not limited to, semiconductive materials, insulating materials, conductive materials, etc. The term "substrate" also means and includes organic substrates, for example, substrates having multiple metal layers in the form of conductive traces and vias interposed with dielectric layers (e.g., resin-glass weave polymers). For example, ball grid array (BGA) packages include multiple die and encapsulation (e.g., epoxy molding compound (EMC)) on one side of an organize substrate and an array of solder balls on the other side. Specific, non-limiting examples of substrates include printed circuit boards and interposers.

As used herein, the term "microelectronic component" means and includes by way of non-limiting example, semiconductor die, die exhibiting functionality through other than semiconductive activity, microelectrical mechanical systems (MEMs) devices, substrates comprising multiple die including wafers as well as other bulk substrates as mentioned above, partial wafers substrates including more than one die location, as well as assemblies (e.g., stacks) of multiple die, and assemblies of one or more die on a substrate.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

In the description and for the sake of convenience, the same or similar reference numerals may be used to identify features and elements common between various drawing figures.

Figure 1:
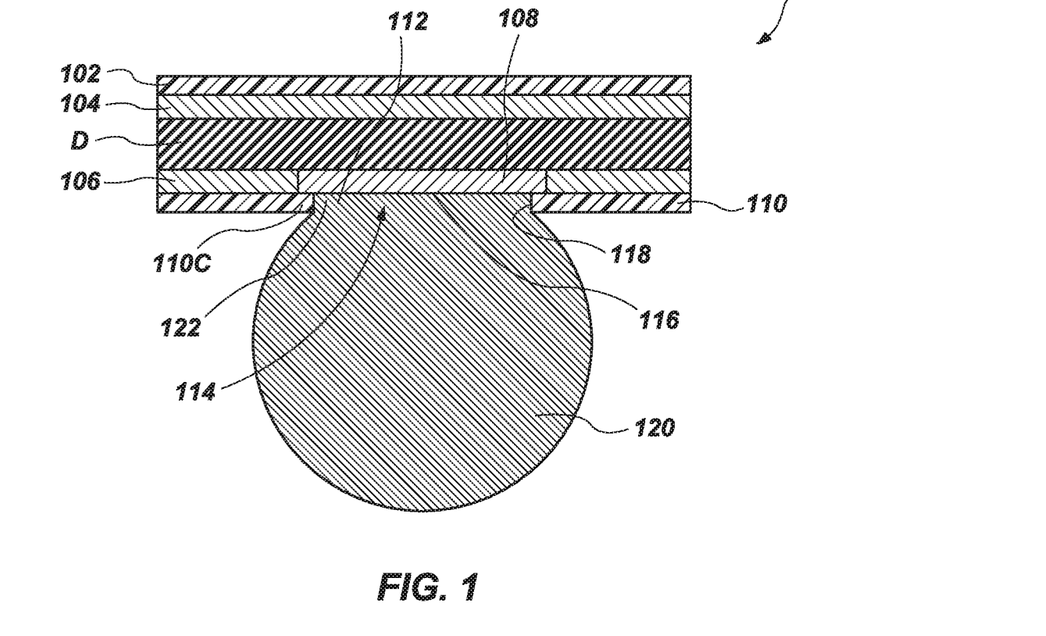
FIG. 1 is a schematic side cross-section of a solder ball metallurgically bonded to a planar terminal pad of a substrate.
Figure 1A:
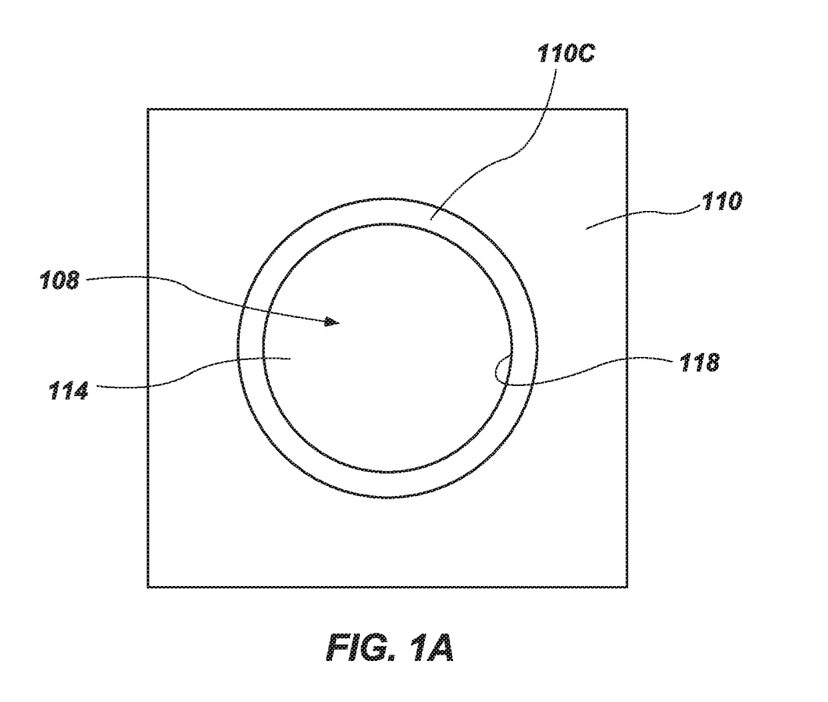
FIG. 1A is a top elevation of a portion of the substrate and the terminal pad of FIG. 1.

Referring now to FIGS. 1 and 1A of the drawings, an example substrate 100 in the form of a printed circuit board includes multiple material layers including, from top to bottom as the drawing is oriented, solder resist (i.e., solder mask) 102, conductive (e.g., copper) trace layer 104, dielectric (e.g., resin-glass weave polymer) layer D, at least conductive trace layer 106 including terminal pads 108 (one shown), and solder resist 110. Conductive trace layers 104 and 106 are electrically coupled by conductive vias (not shown). Of course, substrates comprising additional conductive trace layers interconnected by conductive vias extending through interposed dielectric layers are well known, and substrate 100 is merely depicted and described as a simple example for clarity and not limitation. A central portion 114 of terminal pad 108 is exposed through aperture 112 in solder resist 110, a portion 110C of solder resist 110 overlapping a periphery of terminal pad 108 as may be clearly seen in FIG. 1A. Solder ball 120, which may be formed of any suitable solder, such as a tin\silver solder, for example, SAC 302, SAC 305 is metallurgically bonded to planar surface 116 of the central portion 114 of terminal pad 108, the periphery 122 of solder ball bonded to planar surface 116 being laterally constrained by the inner periphery 118 of solder resist 110 in what is commonly termed a solder mask defined (SMD) joint. Solder joints may be solder mask defined (SMD) or non-solder mask defined (NSMD). SMD joints are formed with a solder mask opening smaller than an associated pad (e.g., bond pad) so the solder joint is peripherally constrained by the surrounding solder mask material, while NSMD joints are formed with a solder mask opening larger than an associated pad and the solder joint bonds to the underlying pad with no peripheral constraint of solder mask material. As may be readily appreciated by those of ordinary skill in the art, the interface between the central portion 114 of terminal pad 108 and solder ball 120 is flat, has a limited surface area and, so, is particularly susceptible to cracking or delamination at or proximate the interface between the solder ball 120 and the central portion of terminal pad. Both SMD and NSMD joints experience this type of bond failure, resulting in an open circuit.

Referring now to FIGS. 2 and 2A-2C, an embodiment of a substrate 200 including terminal pads (one shown) according to embodiments of the disclosure will be described. As with substrate 100, substrate 200 includes multiple material layers including, from top to bottom as the drawing is oriented, solder resist (i.e., solder mask) 102, conductive (e.g., copper) trace layer 104, dielectric (e.g., resin-glass weave polymer) layer D, conductive trace layer 106 including terminal pads 108P (one shown), and solder resist 110. Conductive trace layers 104 and 106 are electrically coupled by conductive vias (not shown). A central portion 114P of terminal pad 108P is exposed through aperture 112 in solder resist 110, a portion 110C of solder resist 110 overlapping a periphery of terminal pad 108P as may be clearly seen in FIGS. 2, 2A-2C. Further, as in the case of substrate 100, substrates having terminal pads configured according to embodiments of the disclosure and comprising additional conductive trace layers interconnected by conductive vias extending through interposed dielectric layers are well known, and substrate 200 is merely depicted and described as a simple example for clarity and not limitation. As with substrate 100, the solder joint is SMD, although embodiments of the disclosure may also be implemented with NSMD joints.

Figure 2:
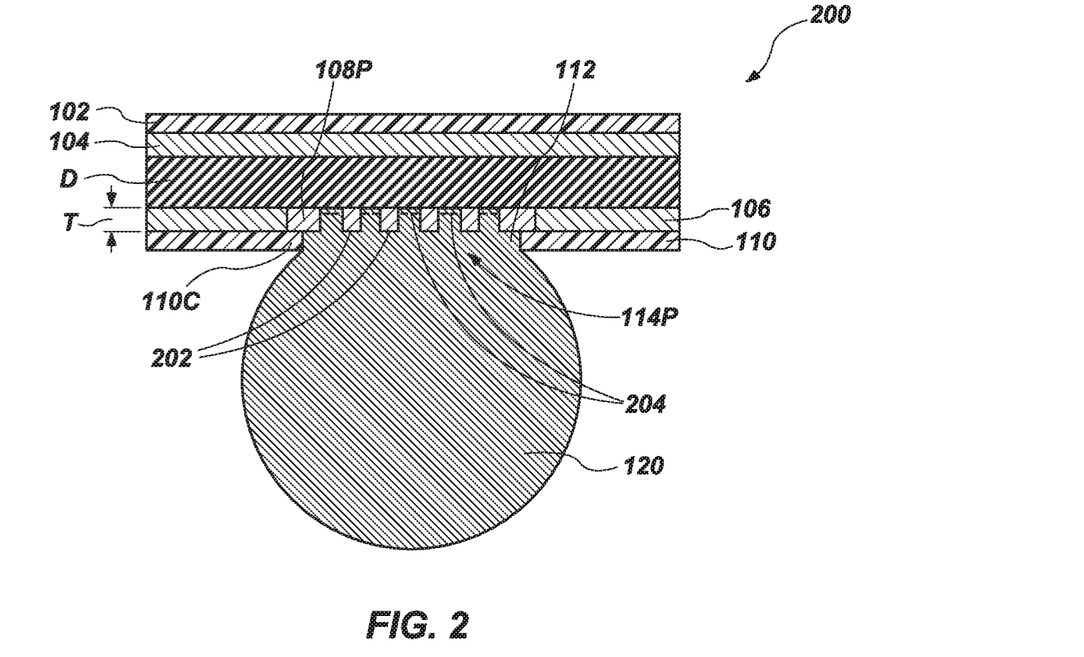
FIG. 2 is a schematic side cross-section of a solder ball metallurgically and mechanically bonded to a terminal pad of a substrate configured according to embodiments of the disclosure.
Figure 2A:
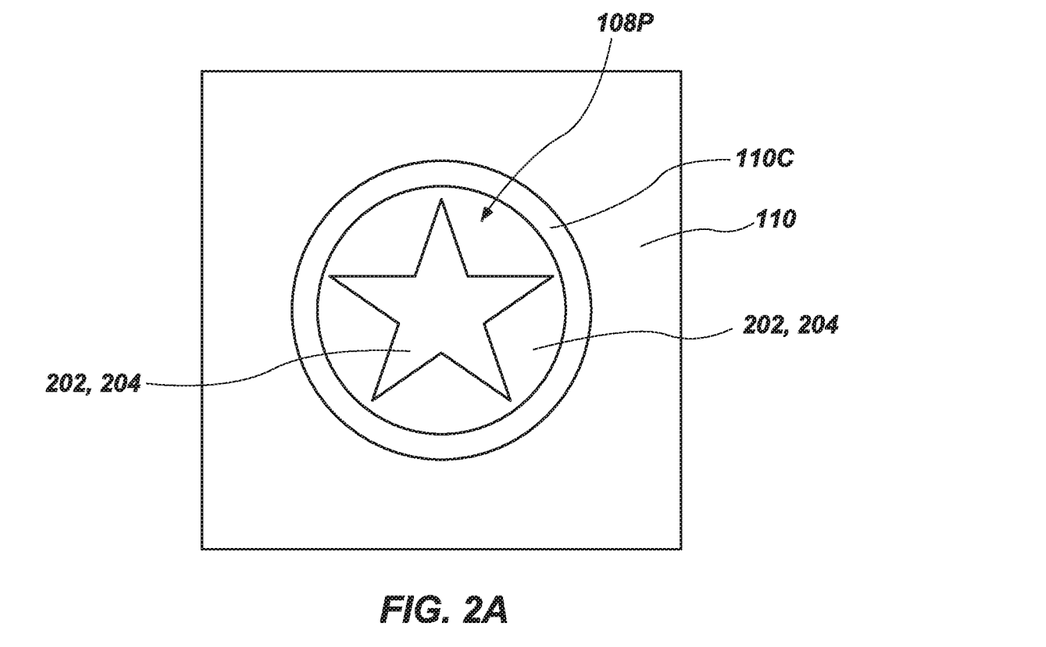
FIGS. 2A-2C are schematic top elevations of various implementations of the terminal pad of FIG. 2 configured according to embodiments of the disclosure.
Figure 2B:
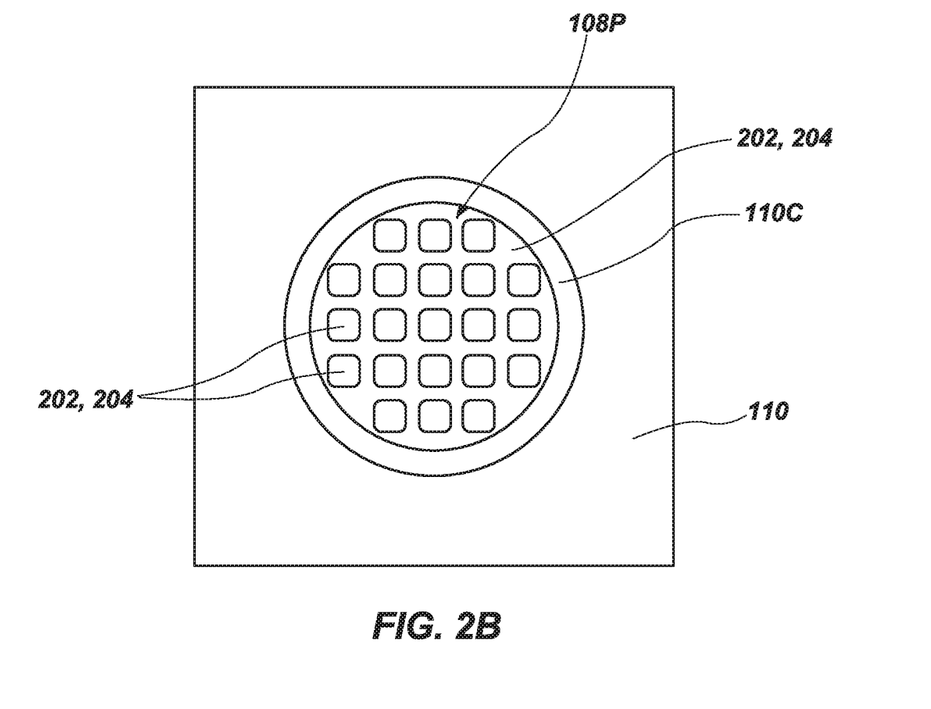
Figure 2C:
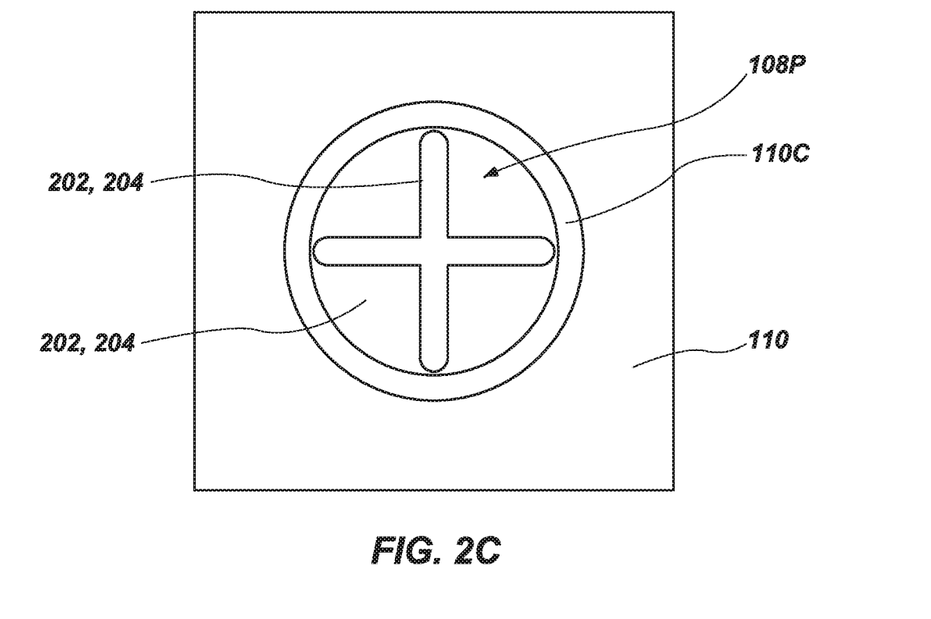

Referring now to FIG. 2, central portion 114P of terminal pad 108P, rather than being a planar surface, exhibits what may be characterized as an irregular surface topography in the form of protruding portions 202 and recess portions 204, various implementations of which are illustrated in embodiments of FIGS. 2A-2C. It should be noted that terminal pad 108P is of the material of conductive trace layer 106 and is integral with an associated conductive trace, terminal pad 108P being formable concurrently with an associated trace of conductive trace layer 106 and of a same thickness T by blanket metal deposition (e.g., electroplating) followed by masking and etching of the metal, as is known. However, in implementation of embodiments of the disclosure, the terminal pad 108P, in addition to being peripherally defined by etching, is also topographically defined into a three-dimensional structure by the etch process. In other words, the central portion 114P of terminal pad 108P is patterned and then etched to produce protruding portions 202 and recess portions 204 together comprising a three-dimensional surface topography for terminal pad 108P. As depicted in FIG. 2, protruding portions 202 may remain at a height and of a thickness corresponding to the thickness T of conductive trace layer 106. Recess portions 204, on the other hand may, in some embodiments, exhibit a depth corresponding to the thickness T of conductive trace layer 106. Stated another way, recess portions 204 may be configured as an aperture or apertures, as shown, extending completely through the thickness T of conductive trace layer 106 to dielectric layer D. Alternatively, recess portions 204 may be configured as blind recesses extending substantially into, but not through, the thickness T of conductive trace layer 106, as shown in broken lines in recess portions 204, to a level proximate but not exposing dielectric core D. For example, conductive trace layer 106 may have a thickness T of between about 5 µm and about 20 µm, and recess portions 204 may terminate as blind recesses within the material of terminal pad 108P such that about 10% to about 20% of the thickness T remains at the bottoms of recesses 204 as a floor and connection to protruding portions 202 for structural integrity and electrical continuity of terminal pad 108P. Stated another way, the depth of the irregular surface topography of the terminal pad may be between about 80% and 100% of the thickness T of the terminal pad. Accordingly, the presence of one or more protruding portions 202 and one or more recess portions 204 of terminal pad 108P provides significantly more surface area to metallurgically bond to the material of solder ball 120 than planar surface 116 of terminal pad 108. In addition, the one or more protruding portions 202 and the one or more recess portions 204 allow a mechanical interlock with the material of solder ball 120, with the material of solder ball 120 extending into the recess portion or portions 204.

Referring now to FIGS. 2A-2C, various embodiments of terminal pad 108P are illustrated. As depicted in FIG. 2A, terminal pad 108P may be configured as a central, star-shaped recess portion 204 surrounded by a remainder of terminal pad 108P comprising protruding portion 202 extending to the outer periphery of terminal pad 108P. Alternatively terminal pad 108P may be configured with a star-shaped protruding portion 202 surrounded by a recess portion 204. As shown, terminal pad 108P may be configured, in combination with portion 110C of solder resist 110 overlapping an outer circumference thereof, for formation of a SMD joint. As depicted in FIG. 2B, terminal pad 108P may be configured as an array of protruding portions 202 configured as mutually laterally spaced pillars, recess portion 204 surrounding and between protruding portion 202, or a protruding portion 202 encompassing an array of recess portions 204. The outer periphery of terminal pad 108P overlapped by portion 110C of solder resist 110 may also be configured as a protruding portion 202, supporting the portion 110C of solder resist 110 to produce an SMD joint. As depicted in FIG. 2C, terminal pad 108P may be configured with a cross-shaped recess portion 204 centered on terminal pad 108P, the remainder of terminal pad 108P comprising a protruding portion 202, or a cross-shaped protruding portion 202 surrounded by a recess portion 204. The outer periphery of terminal pad 108P is, again, overlapped by portion 110C of solder resist 110 to produce a SMD joint. However, as noted above, implementation of embodiments of the disclosure with a solder resist inner periphery surrounding, and radially outwardly spaced from, a terminal pad 108P may also be easily effected. Further, the embodiments of FIGS. 2A-2C are merely non-limiting examples of terminal pad topography, and many other topographical configurations may be implemented. For example, cylindrical, elliptical, triangular or polyhedral cross-sectional protruding portions configured as pillars may be formed, and pillars of differing cross-sectional configurations may be provided on the same terminal pad. Similarly, asymmetrical arrangements of protruding portions, as well as protruding portions of different cross-sectional areas may be provided on the same terminal pad. In addition, the number, type, location and relative cross-sectional areas of protruding and recess portions may be optimized by mathematical modeling to accommodate anticipated stresses on the solder ball-to-terminal pad interface for specific applications and in consideration of particular solder ball patterns joining adjacent components.

In all of the embodiments of terminal pad 108P, pad surface area for metallurgical bonding solder ball 120 may be significantly enhanced by the presence of protruding portions 202 and recess portions 204 in comparison to that afforded by the planar surface 116 of terminal pad 108. Further, the presence of one or more protruding portions 202 and one or more recess portions 204 in terminal pad 108P provides a mechanical interlock between material of solder ball 120 and the vertical surfaces of protruding portion or portions 202, the interlock providing a reinforcement against shear forces that may arise during thermal cycling of assembled microelectronic components, particularly when non-uniform solder ball patterns are employed, or one side of the assembly is subjected to significantly different temperature swings during operation than an opposing side, aggravating the effects of thermal cycling. In addition, it is contemplated that the presence of vertical sidewall surfaces comprising boundaries between protruding portions 202 and recess portions 204 may arrest solder ball crack propagation or delamination progress across a terminal pad when such a boundary is encountered by the crack or delamination.

Figure 3:
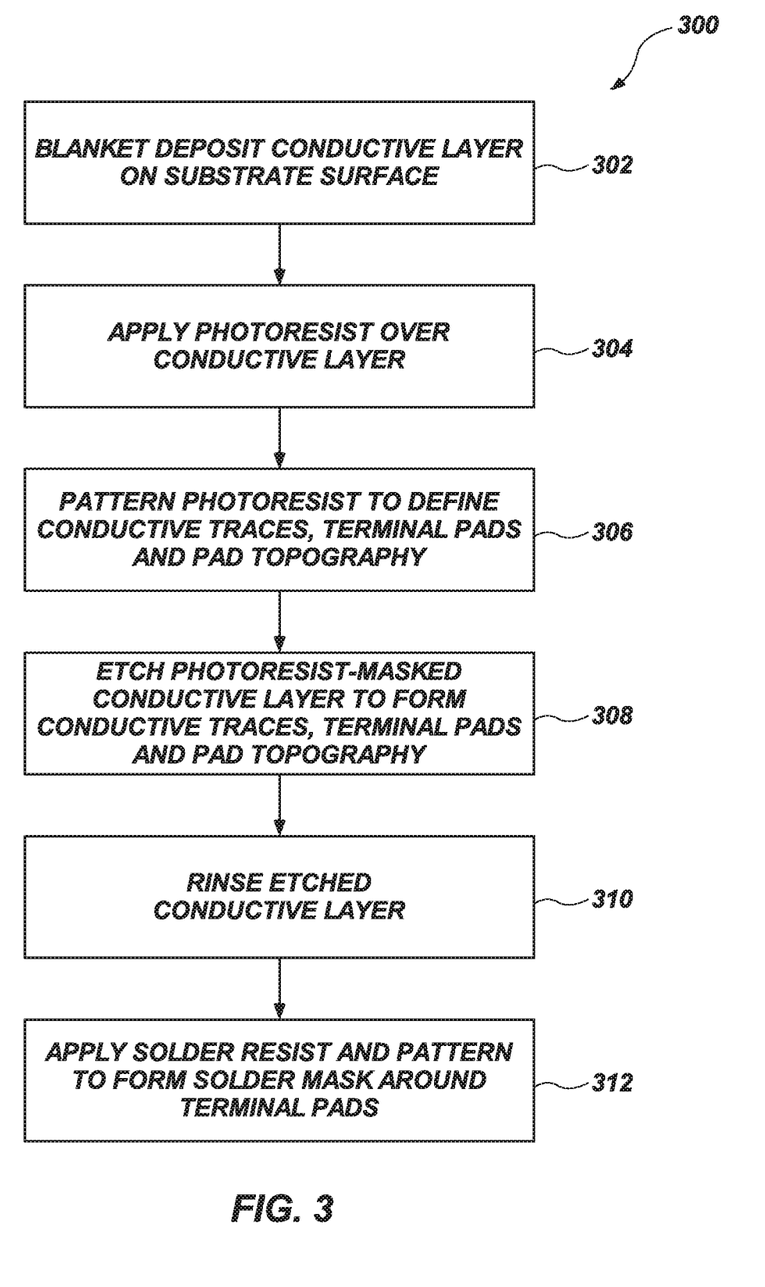
FIG. 3 is a flow diagram of a process for forming terminal pads on substrates according to embodiments of the disclosure.

FIG. 3 depicts a process sequence 300 for fabrication of terminal pads on a substrate according to embodiments of the disclosure. In act 302 a substrate has a conductive layer of metal material (e.g., copper) blanket deposited on a surface thereof, such as a dielectric layer. The blanket deposition may include disposition of a metal seed material followed by electroplating of the conductive layer to a desired thickness. In act 304, a photoresist is applied over the conductive layer. In act 306, the photoresist is patterned to define conductive traces extending to integral terminal pads of the metal material, and to define a topography for each terminal pad to include one or more protruding portions and one or more recess portions. In some implementations, for example, the embodiments of FIGS. 2A and 2C, the photoresist may be patterned using a photolithographic mask, then exposed and developed to form the desired pattern for subsequent etching of the conductive layer. In other implementations, for example, those, as in one variant of the embodiment of FIG. 2B, protruding portions 202 include isolated, laterally spaced discrete protrusions, it may be desirable to use a maskless aligner to pattern the photoresist. Such maskless aligners are commercially available from, for example, EV Group (and identified as MLE technology), headquartered in Austria and having various U.S. locations, and from Heidelberg Instruments, Inc. (and identified as MLA 150) of Torrance, Calif. In act 308, the photoresist-masked conductive layer is etched to form conductive traces, terminal pads and pad topography. For etching copper, wet etchants in the form of ferric chloride solutions such as CE-100, CE-200 and APS-100 etchants from Transene Company, Inc. of Danvers, Mass., or similar products from Sigma-Aldrich may be employed. In act 310, any residual etchant is removed from the etched conductive layer by rinsing with deionized water, and in a further optional act 312, a solder resist is applied and patterned to form a mask around the terminal pads with apertures sized and configured for SMD or NSMD implementations. Subsequently, depending upon the intended application for the substrate, the substrate may be left with exposed terminal pads 108P awaiting disposition of a solder ball-equipped microelectronic component (e.g., semiconductor die or die stack) thereon, or the terminal pads 108P may be bumped with solder balls or masses of solder paste reflowed to metallurgically and mechanically bond to terminal pads 108P for use in subsequent attachment of the substrate to higher level packaging.

Figure 4:
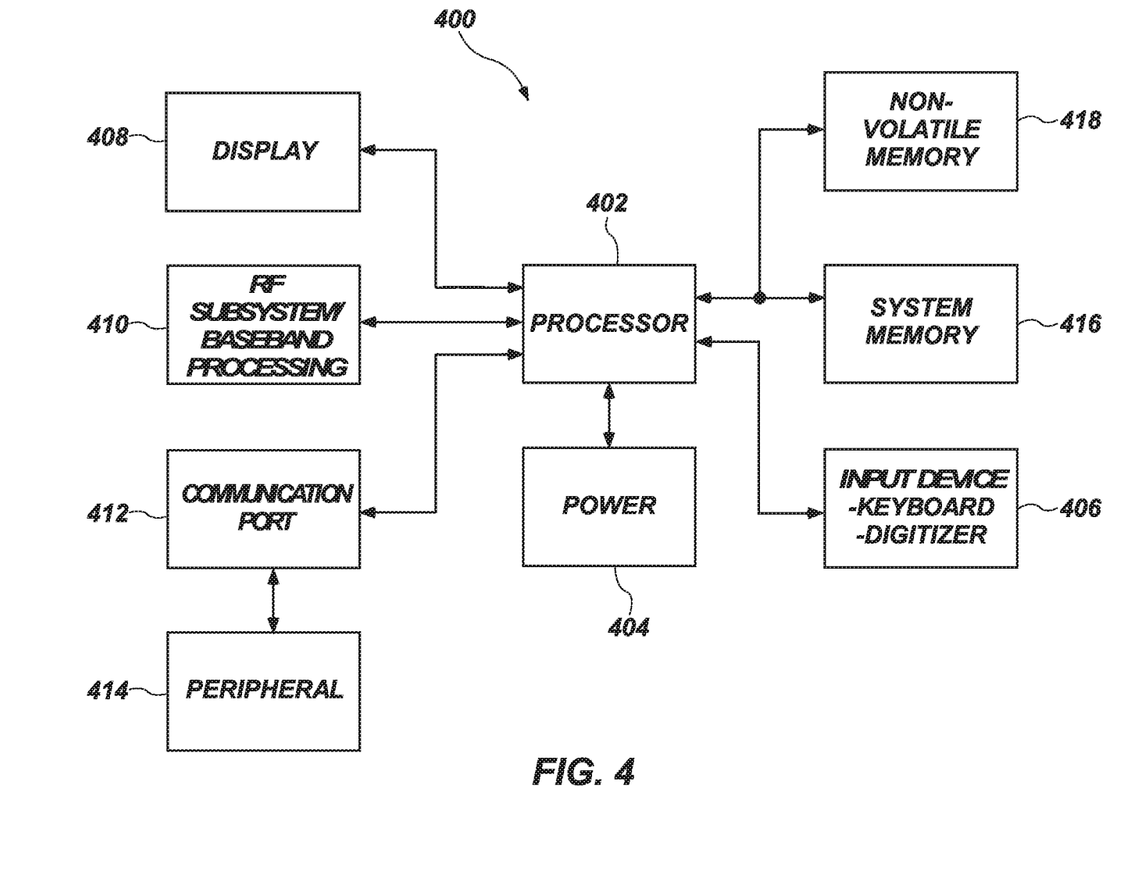
FIG. 4 is a block diagram of a processor-based system including microelectronic components including interconnections comprising conductive elements in the form of solder joints secured to terminal pads of substrates configured according to embodiments of the disclosure.

With reference to FIG. 4, a processor-based system 400 is depicted. The processor-based system 400 may include various microelectronic devices (e.g., microelectronic devices including substrates equipped with terminal pads configured in accordance with embodiments of the present disclosure). The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include microelectronic devices (e.g., microelectronic devices including substrates equipped with terminal pads configured in accordance with embodiments of the present disclosure).

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the microelectronic devices (e.g., the microelectronic devices including substrates equipped with terminal pads configured in accordance with embodiments of the present disclosure).

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as the microelectronic devices (e.g., the microelectronic devices including substrates equipped with terminal pads configured in accordance with embodiments of the present disclosure).

Figure 5:
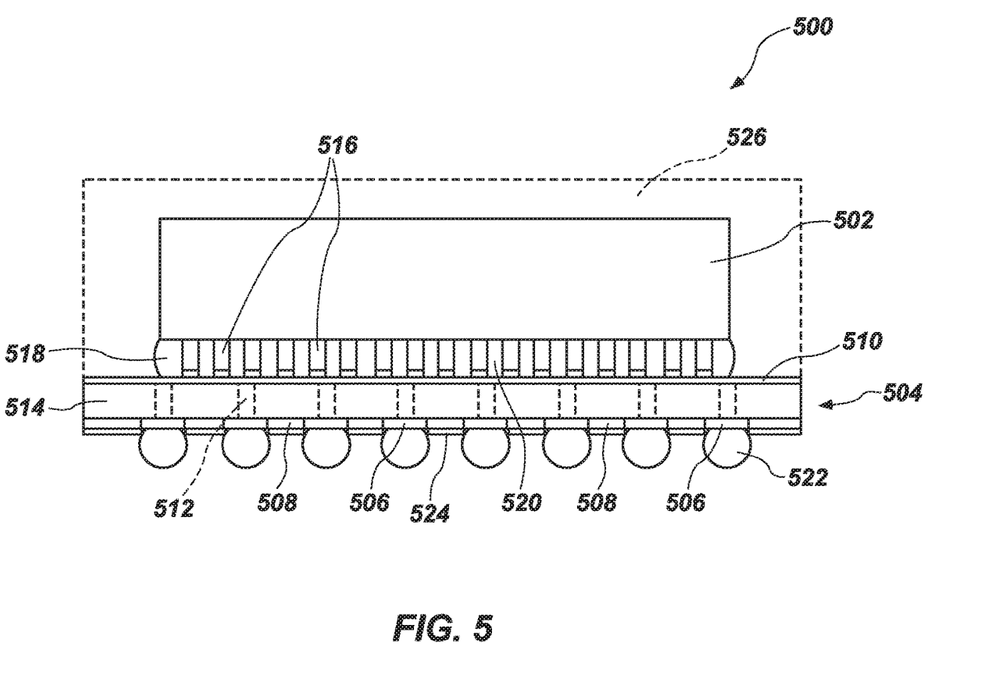
FIG. 5 is a schematic side elevation of an apparatus in the form of a microelectronic component package including a substrate equipped with terminal pads according to embodiments of the disclosure.

Referring now to FIG. 5, a microelectronic component package 500 includes a microelectronic component 502 (e.g., a semiconductor die) on a substrate 504 equipped with terminal pads 506 according to embodiments of the disclosure. The terminal pads 506 are on a side of the substrate 504 opposite the microelectronic component 502 and operably coupled to adjacent conductive traces 508, which conductive traces 508 are connected to other conductive traces 510 on an opposite side of substrate 504 by vias 512 extending through dielectric material 514 of substrate 504. Substrate 504 may include additional, internal levels of conductive traces (not shown) interconnected by vias (not shown). Microelectronic component 502 is, by way of example only, operably coupled to terminal portions of conductive traces 510 by discrete conductive elements 516 (e.g., metal pillars capped with solder). A dielectric material (e.g., non-conductive film (NCF), wafer level underfill film (WLUF)) 518 is located in the bond line 520 between microelectronic component 502 and substrate 504. Terminal pads 506 have solder bumps 522 bonded to an irregular surface topography of the terminal pads 506 and surrounded by solder resist 524. Microelectronic component 502 may be encapsulated, for example, in an epoxy molding compound (EMC) 526 as shown in broken lines, extending to substrate 504.

As will be appreciated by those of ordinary skill in the art, various embodiments of the disclosure provide advantages not realized by the state of the art. For example, the metallurgical and mechanical interface strength between a terminal pad of a substrate and an associated solder ball is superior to that provided by a planar terminal pad configuration. Further, embodiments of the disclosure may be implemented using existing processes and materials employed in substrate fabrication, and without the need for additional process acts.

In some embodiments, an apparatus comprises a substrate having at least two conductive trace layers and at least one dielectric layer between the at least two conductive trace layers, one conductive trace layer of the at least two conductive trace layers comprising multiple conductive traces respectively terminating at associated terminal pads integral on one side of the substrate with metal material of the conductive traces, at least one microelectronic component operably coupled to conductive traces of another of the at least two conductive trace layers on an opposite side of the substrate. At least one terminal pad has an irregular surface topography comprising at least one protruding portion of a same thickness as a thickness of a respectively associated conductive trace and at least one recess portion extending into the terminal pad at least to a depth proximate the dielectric layer. Solder balls are bonded to the terminal pads.

In other embodiments, a method of fabricating terminal pads on a substrate comprises blanket depositing a conductive layer of metal material on a dielectric surface of a substrate, applying a photoresist over the conductive layer, patterning the photoresist to define conductive traces, terminal pads and terminal pad surface topography on the conductive layer, applying an etchant to the photoresist-masked conductive layer to form conductive traces, terminal pads and irregular surface topography on the terminal pads and removing the etchant.

In further embodiments, an electronic system comprises microelectronic components in the form of one or more input devices, one or more output devices, one or more microprocessor devices, and one or more memory devices, one or more of the input devices, output devices, microprocessor devices and memory devices comprising a substrate having terminal pads configured with an irregular surface topography comprising, integral with and of a same thickness of conductive traces comprising a single material and respectively associated with the terminal pads.

In still further embodiments, a microelectronic component assembly comprises a first microelectronic component having terminal pads on a surface thereof, a second microelectronic component having terminal pads of a surface thereof facing the surface of the first microelectronic component and solder ball extending between, and bonded to, terminal pads of the first and second microelectronic components. The terminal pads of at least one of the first and second microelectronic components are integral with and of the same material and thickness as a material and thickness of associated conductive traces, the terminal pads each exhibiting an irregular surface topography within the thickness thereof into which material of a solder ball extends.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An apparatus, comprising:
   a substrate having at least two conductive trace layers and at least one dielectric layer between the at least two conductive trace layers, one conductive trace layer of the at least two conductive trace layers comprising multiple conductive traces on one side of the substrate respectively terminating at associated terminal pads integral with metal material of the conductive traces;
   at least one microelectronic component operably coupled to conductive traces of another of the at least two conductive trace layers on an opposite side of the substrate;
   at least one associated terminal pad having an irregular surface topography comprising at least one protruding portion of a same thickness as a thickness of a respectively associated conductive trace and at least one recess portion extending into the terminal pad at least to a depth proximate the dielectric layer; and
   solder balls bonded to the associated terminal pads.

2. The apparatus of claim 1, the at least one recess portion extending through the thickness of the at least one associated terminal pad to the dielectric layer.

3. The apparatus of claim 1, the at least one recess portion comprising a blind recess terminating within the thickness of the at least one associated terminal pad.

4. The apparatus of claim 3, about 10% to about 20% of the thickness of the at least one associated terminal pad remaining between a floor of the blind recess and the dielectric layer.

5. The apparatus of claim 1, the at least one protruding portion of the at least one associated terminal pad comprising a protruding portion extending to and around a periphery thereof.

6. The apparatus of claim 5, the at least one protruding portion of the at least one associated terminal pad comprising at least one other protruding portion laterally spaced from the protruding portion extending to and around a periphery thereof.

7. The apparatus of claim 6, the at least one other protruding portion comprising multiple, mutually spaced protruding portions separated from one another and from the protruding portion extending to and around the periphery of the at least one associated terminal pad by one or more recess portions.

8. The apparatus of claim 7, the multiple, mutually spaced protruding portions being configured as pillars having vertical sidewalls.

9. The apparatus of claim 1, the at least one protruding portion and the at least one recess portion of the at least one associated terminal pad being separated by at least one vertical sidewall.

10. The apparatus of claim 1, the at least one recess portion consisting of a single recess surrounded by a protruding portion extending to a periphery of the at least one associated terminal pad.

11. A method of fabricating the apparatus of claim 1, the method comprising:
    blanket depositing a conductive layer of metal material on a surface of the at least one dielectric layer on the one side of the substrate;
    applying a photoresist over the conductive layer of metal material;
    patterning the photoresist to define the multiple conductive traces, the associated integral terminal pads and terminal pad surface topography on the conductive layer;
    applying an etchant to the photoresist-masked conductive layer to form the multiple conductive traces, the multiple associated integral terminal pads and the irregular surface topography on the at least one associated terminal pad; and
    removing the etchant.

12. The method of claim 11, comprising patterning the photoresist using a maskless aligner.

13. The method of claim 11, comprising applying an etchant using a wet etchant, and removing the etchant is effected by rinsing.

14. The method of claim 11, further comprising applying a solder resist over the dielectric surface, the conductive traces and the terminal pads and patterning the solder resist to form a solder mask having apertures exposing at least central portions of the terminal pads.

15. The method of claim 14, patterning the solder resist to form a solder mask having apertures exposing at least central portions of the terminal pads comprising forming apertures with edges spaced from and surrounding the terminal pads.

* * * * *